(12) United States Patent
Claflin et al.

(10) Patent No.: US 12,000,062 B1
(45) Date of Patent: Jun. 4, 2024

(54) METHOD FOR THE DEPOSITION OF MONOCRYSTALLINE OR POLYCRYSTALLINE TIN ALLOYS ON CRYSTALLOGRAPHCIALLY MIS-MATCHED OR AMORPHOUS SUBSTRATES

(71) Applicant: Government of the United States, as represented by the Secretary of the Air Force, Wright-Patterson AFB, OH (US)

(72) Inventors: Bruce B. Claflin, Dayton, OH (US); Gordon J. Grzybowski, Kettering, OH (US); Arnold M. Kiefer, Dayton, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 797 days.

(21) Appl. No.: 16/526,015

(22) Filed: Jul. 30, 2019

(51) Int. Cl.
*H01L 21/3205* (2006.01)
*C23C 16/06* (2006.01)
(Continued)

(52) U.S. Cl.
CPC ............ *C30B 25/105* (2013.01); *C23C 16/06* (2013.01); *C23C 16/50* (2013.01); *C30B 25/165* (2013.01);
(Continued)

(58) Field of Classification Search
CPC .................... H01L 21/02384; H01L 21/02452
See application file for complete search history.

(56) References Cited

U.S. PATENT DOCUMENTS 4,908,330 A 3/1990 Arai et al.
5,018,479 A 5/1991 Markunas et al.
(Continued)

FOREIGN PATENT DOCUMENTS

WO 2012130933 A1 10/2012

OTHER PUBLICATIONS

Anthony, B.; Hsu, T.; Breaux, L.; Qian, R.; Banerjee, S.; Tasch, A.; "Remote Plasma-Enhanced CVD of Silicon: Reaction Kinetics as a Function of Growth Parameters," Journal of Electronic Materials, vol. 19, No. 10, 1990, pp. 1089-1094.
(Continued)

*Primary Examiner* — Thomas T Pham
(74) *Attorney, Agent, or Firm* — AFMCLO/JAZ; Charles R. Figer, Jr.

(57) ABSTRACT

A method for depositing a monocrystalline or polycrystalline tin alloy layer on an amorphous or crystallographically mis-matched substrate. The method includes selecting tin halide as the tin source; selecting an alloying metal precursor from germanium precursors, silicon precursors, and mixtures of germanium and silicon precursors; selecting a substrate from amorphous substrates and crystallographically mis-matched substrates; generating an inert gas plasma in a remote plasma generation reactor; contacting the inert gas plasma with the tin halide to provide an activated tin halide flow stream; contacting the inert gas plasma with the alloying metal precursor to provide an activated alloying metal flow stream; directing the activated tin halide flow stream and activated alloying metal flow stream to an alloy deposition chamber physically remote from the plasma chamber; and depositing the monocrystalline or polycrystalline tin alloy layer on the substrate in the deposition chamber.

10 Claims, 1 Drawing Sheet

(51) Int. Cl.
*C23C 16/50* (2006.01)
*C30B 25/10* (2006.01)
*C30B 25/16* (2006.01)
*C30B 29/52* (2006.01)
*H01L 21/02* (2006.01)

(52) U.S. Cl.
CPC ........ *C30B 29/52* (2013.01); *H01L 21/02535* (2013.01); *H01L 21/02595* (2013.01); *H01L 21/02598* (2013.01); *H01L 21/0262* (2013.01)

(56) References Cited

U.S. PATENT DOCUMENTS

| | | | |
|---|---|---|---|
| 7,476,627 B2 * | 1/2009 | Pomarede | H01L 21/28017 438/795 |
| 8,921,207 B2 | 12/2014 | Tolle | |
| 9,029,264 B2 | 5/2015 | Sanchez et al. | |
| 9,793,115 B2 | 10/2017 | Tolle | |
| 2006/0094250 A1 * | 5/2006 | Lee | H01L 21/76814 257/E21.507 |
| 2006/0199357 A1 * | 9/2006 | Wan | H01L 21/67115 257/E21.247 |
| 2012/0186641 A1 * | 7/2012 | Sharps | H01L 31/1844 257/E31.023 |
| 2013/0137249 A1 * | 5/2013 | Olsen | H01L 21/2236 438/513 |
| 2013/0240478 A1 * | 9/2013 | Sanchez | C23C 16/06 216/75 |
| 2013/0280891 A1 | 10/2013 | Kim et al. | |
| 2014/0020619 A1 | 1/2014 | Vincent et al. | |
| 2015/0147488 A1 | 5/2015 | Choi et al. | |
| 2016/0314967 A1 * | 10/2016 | Tolle | H01L 29/161 |
| 2017/0047446 A1 | 2/2017 | Margetis et al. | |
| 2017/0121845 A1 | 5/2017 | Grützmacher et al. | |
| 2017/0154770 A1 * | 6/2017 | Margetis | H01L 29/161 |
| 2017/0316980 A1 * | 11/2017 | Chang | H01L 29/7848 |
| 2019/0296131 A1 * | 9/2019 | Kim | H01L 29/122 |

OTHER PUBLICATIONS

Hsu, T.; Anthony, B.; Qian, R.; Irby, J.; Kinosky, D.; Mahajan, A.; Banerjee, S.; Magee, C.; Tasch, A.; "Advances in Remote Plasma-enhanced Chemical Vapor Deposition for Low Temperature In Situ Hydrogen Plasma Clean and Si and Si1-xGex Epitaxy," Journal of Electronic Materials, vol. 21, No. 1, 1992, pp. 65-74.

Kinosky, D.; Qian, R.; Irby, J.; Hsu, T.; Anthony, B.; Banerjee, S.; Tasch, A.; Magee, C.; Grove, C. L.; "Low-temerature growth of GexSi1-x/Si heterostructurees on Si(100) by remote plasma-enhanced chemical vapor deposition," Appl. Phys. Lett. vol. 59, No. 7, Aug. 12, 1991, pp. 817-819.

Qian, R.; Anthony, B.; Hsu, T.; Irby, J.; Kinosky, D.; Banerjee, S.; Tasch, A.; Rabenberg, L.; Magee, C.; "Crystallographic characterization of GexSi1-x/Si superlattices grown by remote plasma-enhanced chemical vapor deposition," J. Appl. Phys, vol. 70 No. 6, Sep. 15, 1991, pp. 3324-3328.

Qian, R.; Kinosky, D.; Hsu, T.; Irby, J.; Mahajan, A.; Thomas, S.; Anthony, B.; Banerjee, S.; "Growth of GExSi1-x/Si Heteroepitaxial films by remote plasma chemical vapor deposition," J. Vac. Sci. Technol. A vol. 10 No. 4, Jul./Aug. 1992, pp. 1920-1926.

Qian, R; Anthony, B; Hsu, T; Irby, J; Kinosky, D; Banerjee, S; Tasch, A.; Structural Analysis of GexSi1-x/Si Layers by Remote Plasma-enhanced Chemical Vapor Deposition on Si (100); Journal of Electronic Materials, vol. 21, No. 4, 1992, pp. 395-399.

* cited by examiner

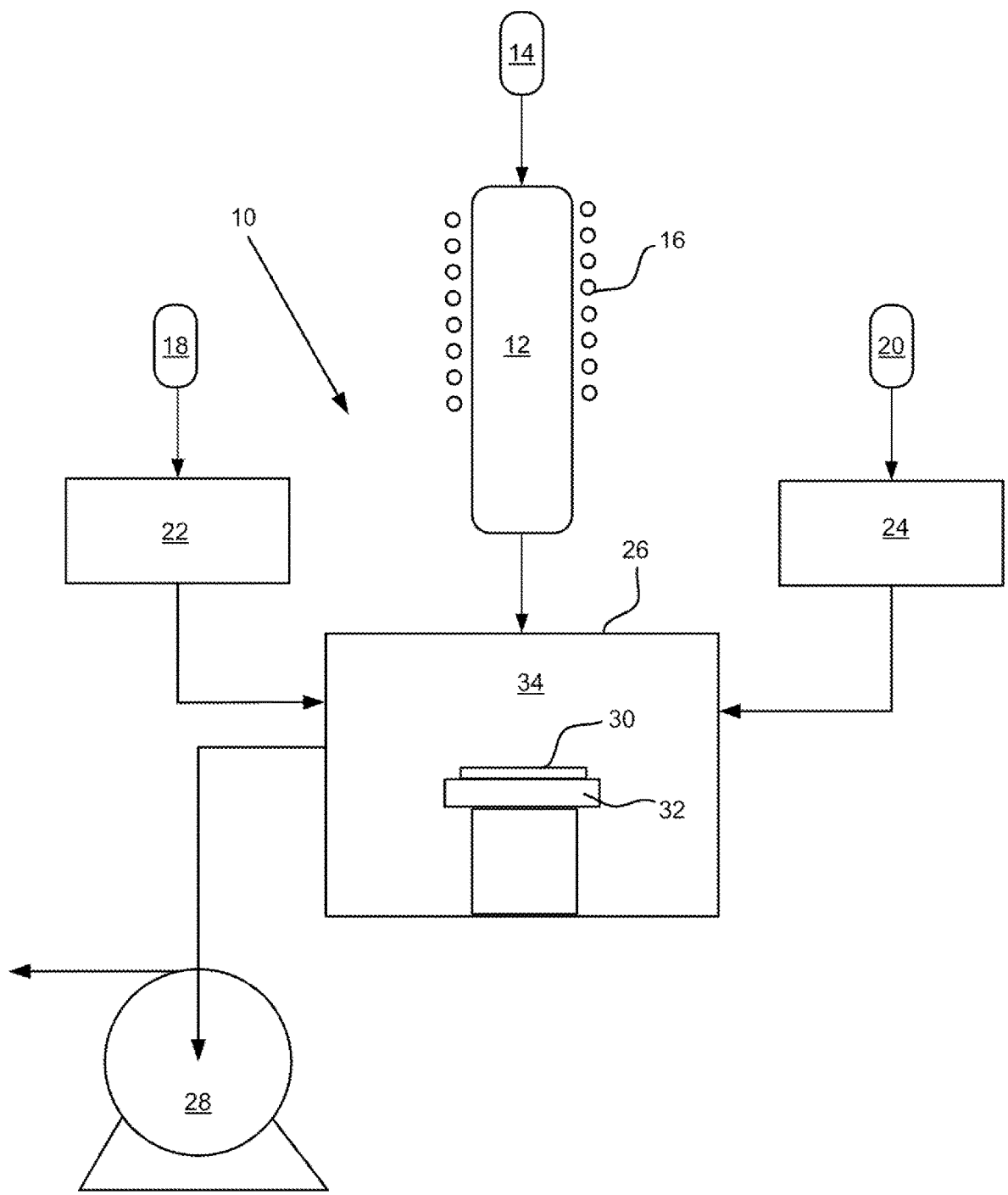

METHOD FOR THE DEPOSITION OF MONOCRYSTALLINE OR POLYCRYSTALLINE TIN ALLOYS ON CRYSTALLOGRAPHCIALLY MIS-MATCHED OR AMORPHOUS SUBSTRATES

RIGHTS OF THE GOVERNMENT

The invention described herein may be manufactured and used by or for the Government of the United States for all governmental purposes without the payment of any royalty.

TECHNICAL FIELD

The present invention is directed to the deposition of tin alloy thin films on substrates in particular the deposition of monocrystalline or polycrystalline tin alloy films on crystallographically mis-matched or amorphous substrates.

BACKGROUND

Thin film semiconductor materials are produced by a variety of physical processes such as solid material evaporation, sputtering, ablation, etc., and by chemical processes such as chemical vapor deposition (CVD). The basic idea of CVD is to create a solid from gas(es). CVD is different from a physical deposition process (e.g. molecular beam epitaxy) where a liquid or solid material is evaporated, sputtered, ablated, etc. and the bare atoms or molecules strike the surface of the substrate to form a solid film. A physical deposition process conveys mono-elemental material from one location to another or mixes multiple elements with no byproducts other than material that doesn't impinge on the substrate. In a CVD process, a chemical reaction takes place between the substrate and one or more molecules producing by-products not incorporated into the film. Thus, CVD is a more complex process due to the variety of byproducts and decomposition pathways that could be followed depending on substrate, gases, and temperature.

In many cases a monocrystalline layer is desired because crystalline material is often needed for high-quality electronic and opto-electronic devices. To this end, the surface atoms need thermal energy to allow them sufficient opportunity to find a stable, crystalline lattice site to form a crystal. A crystalline lattice site is the main concern for molecular beam epitaxy (MBE) growth but not the only one for CVD growth as activation of the precursors must also be achieved. For any chemical reaction to occur in a CVD process there is a minimum amount of energy required. This is commonly known as the activation energy. In many cases the kinetic energy of a molecule at room temperature is sufficient. However, when it is insufficient there are many ways to introduce energy; for example, using light in photochemistry or thermal energy in CVD. Chemical precursors suitable for mass production and transport typically have high bond strengths to promote stability. In a typical CVD of silicon, the activation energy for the chemical reaction is supplied to the precursors by a heated substrate. A typical substrate temperature range is from 500-900° C., depending on the melting temperature of the substrate, the gas flow rate, pressure, molecular species ($SiH_4$, $Si_2H_6$ . . . ), etc. The high temperature also promotes crystalline growth by giving the surface atoms opportunities to move and rearrange themselves into a well-ordered state.

Alloys of tin with germanium and/or silicon are difficult to synthesize in high quality with tin concentrations up to about 30 wt. % using commercially available processes. Such thin film tin alloys are important for use as detectors and emitters such as light emitting diodes and lasers operating in the 2-5 μm mid-wave infra-red spectral region. In the case of unstable or metastable films, such as GeSn, the film's temperature must be kept low to avoid Sn precipitating from the GeSn alloy. (The higher the Sn content, the lower the temperature needed.) Sn is essentially insoluble with both Ge and Si. Growing an alloy of Sn with Ge and/or Si must be through a low-energy path that simultaneously affords the thermal activation of the precursor gases and facilitates formation of a high quality crystalline structure, but at not too great a temperature as to precipitate the Sn from the Ge. This is the basic problem to overcome in making a crystalline GeSn alloy film of any practical use on a commercial basis.

By reducing the substrate temperature below the decomposition temperature of the Sn-alloy, the thermal energy available to activate a chemical process or promote good crystallinity is insufficient. Different schemes have been used to reduce the required precursor activation energy so growth at lower temperatures can be achieved. The primary method to decrease the substrate temperature is by using designer precursors that require less activation energy to decompose on the substrate surface. Examples of this are digermane and deuterated stannane ($SnD_4$). $SnD_4$ is slightly more stable than regular stannane ($SnH_4$) so it is more preferable to use from a practical standpoint, but both will decompose at room temperature and do not require a high substrate temperature. Growth of GeSn using digermane and deuterated stannane can proceed at very low substrate temperatures, in the range of ~250° C. and produce good crystalline quality. However, the foregoing method is difficult to industrialize as $SnD_4$ cannot be produced, stored, and transported before most of the gas decomposes into tin dust and hydrogen. Furthermore, refrigeration is needed throughout the process to prevent decomposition, making the use of $SnD_4$ expensive and cumbersome to use. More stable precursors are desired in order to obtain a commercially viable process.

Also, the known processes typically use a crystalline or crystallographically matched substrate to produce epitaxial layers of thin film tin alloys. There is a need for a process to produce monocrystalline or polycrystalline thin film tin alloys using stable precursor materials that can be deposited on amorphous or crystallographically mis-matched substrates.

SUMMARY OF THE DISCLOSED EMBODIMENTS

In view of the foregoing, embodiments of the disclosure provide a method for depositing a monocrystalline or polycrystalline tin alloy layer on an amorphous or crystallographically mis-matched substrate. The method includes the steps of: selecting tin halide as the tin source; selecting an alloying metal precursor from the group consisting of germanium precursors, silicon precursors, and mixtures of germanium and silicon precursors; selecting a substrate from the group consisting of amorphous substrates and crystallographically mis-matched substrates; generating an inert gas plasma in a remote plasma generation reactor; contacting the inert gas plasma with the tin halide to provide an activated tin halide flow stream; contacting the inert gas plasma with the alloying metal precursor to provide an activated alloying metal flow stream; directing the activated tin halide flow stream and activated alloying metal flow stream to an alloy deposition chamber physically remote from the plasma chamber; and depositing the polycrystalline tin alloy layer on the substrate the deposition chamber.

In one embodiment, there is provided a method for depositing a monocrystalline or polycrystalline tin alloy layer on an amorphous or crystallographically mis-matched substrate. The method includes the steps of: selecting $SnCl_4$ as the tin source; selecting an alloying metal precursor from the group consisting of germanium precursors, silicon precursors, and mixtures of germanium and silicon precursors; selecting a substrate from the group consisting of $Al_2O_3$, TiN, TiW, GaP, Si, Ge, GaAs, and Ge-virtual-substrate (i.e., Ge deposited on another substrate such as Si); generating a helium plasma in a remote plasma generation reactor; contacting the helium plasma with the $SnCl_4$ to provide an activated $SnCl_4$ flow stream; contacting the helium plasma with the alloying metal precursor to provide an activated alloying metal flow stream; directing the activated $SnCl_4$ flow stream and activated alloying metal flow stream to an alloy deposition chamber physically remote from the plasma chamber; and depositing the monocrystalline or polycrystalline tin alloy layer on the substrate in the deposition chamber. A weight ratio of activated alloying metal precursor to activated $SnCl_4$ flow ranges from about 0.5:1 to about 20:1.

In some embodiments, the substrate is selected from $Al_2O_3$, TiN, TiW, GaP, Si, Ge, GaAs, and Ge-virtual-substrate.

In other embodiments, the inert gas is selected from helium, argon, nitrogen, hydrogen, and xenon.

In some embodiments, the substrate is maintained at a temperature ranging from about 250° to about 450° during the deposition process.

In other embodiments, the deposition chamber is maintained at a pressure ranging from about 100 mTorr to about 10 Torr during the deposition process.

In some embodiments, the tin alloy is selected from $Si_{1-x}Sn_x$, $Ge_{1-x}Sn_x$, and $Si_{1-x-y}Ge_xSn_y$, wherein x and y are greater than 0 and less than 1.

In other embodiments the tin halide is selected from $SnCl_4$ and $SnCl_2$. In other embodiments, the alloying metal precursor is selected from the group consisting of silane, disilane, trisilane, germane, digermane, trigermane, and a mixture of two or more of the foregoing. In some embodiments, a weight ratio of activated alloying metal precursor to activated tin halide flow ranges from about 0.5:1 to about 20:1.

In some embodiments, there is provided a monocrystalline or polycrystalline tin alloy layer on an amorphous or crystallographically mis-matched substrate made according to a method described herein.

An important feature of the disclosed embodiments is that the tin alloy thin film material may or may not be an epitaxial semiconductor layer. The disclosed embodiments thus enable the production of high quality tin alloy thin film materials on a variety of substrate materials while using stable, commercially available precursor materials. Such process can be conducted at relatively low temperatures and pressure and with lower precursor gas flows without adversely affecting the substrate material onto which the thin film material is deposited. The process uses a remotely generated plasma gas to activate the precursor materials rather than using a relatively high substrate temperature resulting in relatively pure tin alloy thin film layers. Such materials may be used for making detectors and emitters (light emitting diodes and lasers) operating in the 2 to 5 μm range.

BRIEF DESCRIPTION OF THE DRAWINGS

FIG. 1 is a schematic view of a remote plasma enhanced chemical vapor deposition device for producing monocrystalline or polycrystalline tin alloy layers on a substrate.

DETAILED DESCRIPTION OF THE EMBODIMENTS

As set forth above, the disclosure provides a method for depositing a monocrystalline or polycrystalline tin alloy layer on an amorphous or crystallographically mis-matched substrate. The monocrystalline or polycrystalline tin alloy may be selected from $Si_{1-x}Sn_x$, $Ge_{1-x}Sn_x$, and $Si_{1-x-y}Ge_xSn_y$, wherein x and y are greater than 0 and less than 1.

The process used to deposit the monocrystalline or polycrystalline alloy material is a modified remote plasma enhanced chemical vapor deposition (RPECVD) process using the apparatus as generally described in U.S. Pat. No. 5,018,479 and illustrated schematically in FIG. 1. As shown in FIG. 1, an RPECVD apparatus 10 includes a remote plasma chamber 12 for generation of plasma from a reactive or inert gas source 14. Suitable inert gases include helium, argon, hydrogen, xenon, and nitrogen. Reactive gases include, but are not limited to, hydrogen and oxygen. A power source such as a microwave source, electric heater, or an rf coil 16 may be used to generate plasma in the plasma chamber 12. Between 100 W and 3 KW of rf radiation may be used to generate plasma in the remote plasma chamber 12 using the rf coil 16.

Carrier gases 18 and 20, which may be the same or different, are used to generate gas flows of precursor materials 22 and 24, respectively into a deposition chamber 26. Suitable carrier gases include but are not limited to helium, xenon, hydrogen, nitrogen, oxygen and argon. Gas flows in the range of from about 25 standard cubic centimeters per minute (sccm) to about 1000 sccm may be used. A typical precursor gas may contain from about 1 to about 100 wt. % of the precursor material in the carrier gas. The precursor gases may be introduced into the deposition chamber 26 by use of dispersion rings or shower heads so that the precursor gases can be intimately mixed with the plasma gas from the remote plasma chamber 12.

A vacuum pump 28 may be used to generate a reduced pressure in the deposition chamber 26. The chamber gas pressure during thin film monocrystalline or polycrystalline growth operates in the range of from about 100 mTorr to about 10 Torr, specifically from about 200 mTorr to about 1 Torr, and desirably from about 300 mTorr to about 800 mTorr.

A target or substrate 30 for depositing the thin film monocrystalline or polycrystalline tin alloy thereon is mounted on a heating element 32 in the deposition chamber 26. The substrate is heated by the heating element 32 to a temperature ranging from about 200° to about 400° C., such as from about 250° to about 350° C., or from about 275° to about 325° C. during the deposition process. Suitable substrates may be selected from of $Al_2O_3$, TiN, TiW, GaP, Si, Ge, GaAs, and Ge-virtual-substrate.

The plasma gas generated in the plasma chamber 12 is mixed with the precursor gases from sources 22 and 24 in an interactive region 34 of the deposition chamber 26. The plasma environment in the remote plasma chamber 12 contains many species, even with a simple feed gas like helium. In fact, the feed gas reactive species produced in the remote plasma chamber 12 may include ions, electrons, and a host of excited species all with different composite lifetimes that are influenced by various factors. Flow through the remote plasma chamber 12 carries the excited species downstream into the deposition chamber 26 and toward the substrate 30. The distance that the various species can travel before they are annihilated will depend on their composite lifetimes and the flow velocity. According to the invention, the flow velocity of the feed and carrier gases are controlled so as to control the relative abundance reacted species at a given distance downstream of the region of activation, such as at the mixing and interaction region 34 in the deposition chamber 26. Thus, by controlling the gas flow rates, and by requiring the reactive species of the feed gas to pass from the remote plasma chamber 12 to the mixing and interaction region 34 of the deposition chamber, certain undesirable reactive species are annihilated and only selective reactive species are passed into the mixing and interaction region 34 of the deposition chamber 26. While the plasma chamber 12 and deposition chamber 26 are shown schematically as being two separate vessels, it will be appreciated that any apparatus that can provide spatial filtering of the desired reactive species from a plasma generation device and prevent back diffusion of precursor gases into the plasma zone may be used.

The foregoing RPECVD avoids problems associated with conventional plasma enhanced chemical vapor deposition (PECVD) techniques. There are three primary differences between RPECVD and PECVD. First, the parent gas molecules are not excited in the plasma region but instead react with excited, metastable gas species that flow from the plasma region. These metastable species have well-defined metastable energy states that are 4-20 eV above their ground state, depending upon which gas is used. By selecting the appropriate gas, it is possible to tune the energy increment used in the metastable specie. The transfer of this energy into the parent precursor molecules during collisional events determines the resultant reactive gas phase species. The plug velocity of gas through the plasma generation chamber 12 prohibits back-diffusion of parent molecules into the plasma chamber or region. Because there is a fairly limited number of collisional by-products, the RPECVD process offers more control over the type of species that is incident on the growth surface of the substrate during the deposition process than the PECVD process.

A second primary difference between PECVD and RPECVD is that in RPECVD, unlike in conventional PECVD, the substrates are well removed from the plasma region, minimizing the plasma densities near the substrate. This should result in virtually no sheath fields between the substrate and the plasma in contrast to immersion systems. Ions created by Penning processes in the vicinity of the substrate see no large sheath fields to accelerate them. Furthermore, with typical deposition pressures between 300 and 800 mTorr, the ions are thermalized, reducing their incident energy on the substrates. Considering the damage and embedment that has been observed in silicon from even moderately low energy ions (<50 eV), reduction of ion flux and energy is certainly an advantage offered by RPECVD. This feature allows extremely low deposition temperatures unconstrained by annealing considerations.

A third difference between the RPECVD process to grow thin film layers on a substrate and a typical PECVD process is the pressures used in the RPECVD process. The RPECVD process grows the thin film at a pressure ranging from about 0.1 to about 10 Torr which enables the production of thin film tin alloy layers that have sufficient quality for electronic device applications. On the other hand, the PECVD process uses pressures to grow thin films that are typically much higher than 10 Torr.

In any type of thin film deposition process the cleanliness of the starting surface is of paramount importance. This is especially true in any low temperature deposition process where adsorbed atoms may not have enough mobility unless the energy is provided by some other source other than thermal. In the RPECVD process, two techniques which use the flux of excited or dissociated species from the plasma region to clean substrates of residual contaminants have been developed. The first technique involves dissociation of molecular hydrogen in the plasma region and transport of atomic hydrogen to the substrate surface. There the hydrogen reacts with residual carbon and oxygen atoms forming volatile compounds which leave the surface. Typical operating conditions for this process are 80-100 sccm $H_2$ plasma, 4-5 mTorr, 35 Watts, 300° C. substrate temperature, and 20 sec time duration. Because atomic hydrogen may react with glass walls of a plasma tube, this process has been refined. Now, metastable species of Ar plasma is used to interact with hydrogen to form atomic hydrogen. The plug velocity of the Ar is kept high to prevent hydrogen from back-diffusing into the plasma region. Typical operating conditions for the refined cleaning process are 200 sccm Ar plasma, 50 sccm Hz, 100 mTorr, 50 Watts, 300° C. substrate temperature, and 30 sec time duration. Here as before, the atomic hydrogen reacts with the residual contaminants on the substrate to form volatile compounds and leave the surface.

Following use of the cleaning procedure and before the thin film growth process it is very important to prevent re-contamination of the substrate surface by undesirable gas species which constitute the background or "base" pressure in the deposition chamber 26. These contaminants can impinge the substrate from a variety of sources including the several surfaces present in the deposition chamber 26. Therefore, it is very important to minimize the concentration of these contaminant species through maintaining a very low base pressure, less than $5 \times 10^{-8}$ Torr. Base pressures larger than this value, through contamination of the cleaned substrate surface, will significantly degrade the quality of the thin film layer that is grown on the substrate.

In order to produce a high purity tin-containing alloy thin film material, the RPECVD process was modified. The modified process as described herein uses helium plasma at a flow rate of 25 sccm to about 1000 sccm generated in a remote plasma generation chamber using an rf coil at a frequency of 2 MHz delivering from about 500 watts (W) to about 3 KW rf power. The helium plasma is combined with a tin source and a precursor gas selected from silane, disilane, trisilane, germane, digermane, trigermane, and a mixture of two or more of the foregoing in the deposition chamber. The precursor gases may be mixed with helium or hydrogen as the carrier gas. The amount of germanium precursor and/or silicon precursor gas in the carrier gas may range from about 1 to about 100 wt. %.

The tin source is desirably derived from a liquid tin source such as $SnCl_4$ or $SnCl_2$. A liquid bubbler may be used to entrain the tin source in a carrier gas selected from helium and hydrogen. The amount of entrained tin compound in the carrier gas may range from about 1 to about 100 wt. %. A weight ratio of the germanium and/or silicon precursor to tin compound in the carrier gases in the deposition chamber may range from about 0.5:1 to about 20:1, such as from about 2:1 to about 10:1, or from about 3:1 to about 6:1. Total precursor gas flows may range from about 25 sccm to about 1000 sccm.

In the deposition chamber, the germanium precursor, and/or silicon precursor and the tin precursor compound are activated by the helium plasma so that alloys of Sn/Ge, Sn/Si and/or Sn/Ge/Si are deposited on the selected substrate. As set forth above, the substrate may be selected from $Al_2O_3$, TiN, TiW, GaP, Si, Ge, GaAs, and Ge-virtual-substrate. Prior to deposition of the tin alloy, the substrate is heated to a temperature in the range of from about 200° to about 400° C., such as from about 250° to about 350° C., or from about 275° to about 325° C. The pressure in the deposition chamber during the deposition process may range from about 100 mTorr to about Torr, such as from about 200 mTorr to about 1 Torr, or from about 300 mTorr to about 800 mTorr. The resulting thin film alloy materials may have a composition selected from $Si_{1-x}Sn_x$, $Ge_{1-x}Sn_x$, and $Si_{1-x-y}Ge_xSn_y$, wherein x and y are greater than 0 and less than 1 and a thickness ranging from about 1 nanometer to about 5 microns.

It is noted that, as used in this specification and the appended claims, the singular forms "a," "an," and "the," include plural referents unless expressly and unequivocally limited to one referent. As used herein, the term "include" and its grammatical variants are intended to be non-limiting, such that recitation of items in a list is not to the exclusion of other like items that can be substituted or added to the listed items For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method for depositing a monocrystalline or polycrystalline tin alloy layer on a substrate, comprising the steps of:
    selecting tin halide as a tin source;
    selecting an alloying metal precursor from the group consisting of disilane, trisilane, digermane, trigermane, and a mixture of two or more of the foregoing;
    selecting a substrate from the group consisting of amorphous substrates and crystallographically mis-matched substrates, wherein the substrate is selected from the group consisting of TiN, and TiW;
    generating an inert gas plasma in a remote plasma generation reactor, wherein the inert gas is xenon;
    contacting the inert gas plasma with the tin halide to provide an activated tin halide flow stream;
    contacting the inert gas plasma with the alloying metal precursor to provide an activated alloying metal flow stream;
    directing the activated tin halide flow stream and activated alloying metal flow stream to an alloy deposition chamber physically remote from a plasma chamber; and
    depositing the monocrystalline or polycrystalline tin alloy layer on the substrate in the alloy deposition chamber.

2. The method of claim 1, wherein the substrate is maintained at a temperature ranging from about 250° to about 450° during the deposition process.

3. The method of claim 1, wherein the deposition chamber is maintained at a pressure ranging from about 100 mTorr to about 10 Torr during the deposition process.

4. The method of claim 1, wherein the tin alloy is selected from the group consisting of $Si_{1-x}Sn_x$, $Ge_{1-x}Sn_x$, and $Si_{1-x-y}Ge_xSn_y$, wherein x and y are greater than 0 and less than 1.

5. The method of claim 1, wherein the tin halide is $SnCl_2$.

6. The method of claim 1, wherein a weight ratio of activated alloying metal precursor to activated tin halide flow ranges from about 0.5:1 to about 20:1.

7. A method for depositing a monocrystalline or polycrystalline tin alloy layer on a substrate, comprising the steps of:
    selecting $SnCl_4$ as a tin source;
    selecting an alloying metal precursor from the group consisting of disilane, trisilane, digermane, trigermane, and a mixture of two or more of the foregoing;
    selecting a substrate from the group consisting of TiN, and TiW;
    generating a helium plasma in a remote plasma generation reactor;
    contacting the helium plasma with the $SnCl_4$ to provide an activated $SnCl_4$ flow stream;
    contacting the helium plasma with the alloying metal precursor to provide an activated alloying metal flow stream;
    directing the activated $SnCl_4$ flow stream and activated alloying metal flow stream to an alloy deposition chamber physically remote from a plasma chamber; and
    depositing the monocrystalline or polycrystalline tin alloy layer on the substrate in the alloy deposition chamber, wherein a weight ratio of activated alloying metal precursor to activated $SnCl_4$ flow ranges from about 0.5:1 to about 20:1.

8. The method of claim 7, wherein the substrate is maintained at a temperature ranging from about 250° to about 450° during the deposition process.

9. The method of claim 7, wherein the deposition chamber is maintained at a pressure ranging from about 100 mTorr to about 10 Torr during the deposition process.

10. The method of claim 7, wherein the tin alloy is selected from the group consisting of $Si_{1-x}Sn_x$, $Ge_{1-x}Sn_x$, and $Si_{1-x-y}Ge_xSn_y$, wherein x and y are greater than 0 and less than 1.

* * * * *